United States Patent [19]

Yoshizawa et al.

[11] Patent Number: 5,174,766
[45] Date of Patent: Dec. 29, 1992

[54] ELECTRICAL CONNECTING MEMBER AND ELECTRIC CIRCUIT MEMBER

[75] Inventors: Tetsuo Yoshizawa, Yokohama; Susumu Kadokura, Sagamihara, both of Japan

[73] Assignee: Canon Kabushiki Kaisha, Tokyo, Japan

[21] Appl. No.: 810,444

[22] Filed: Dec. 19, 1991

Related U.S. Application Data

[63] Continuation of Ser. No. 697,776, May 9, 1991, abandoned.

[30] Foreign Application Priority Data

May 11, 1990 [JP] Japan ................... 2-121494
May 11, 1990 [JP] Japan ................... 2-121495
May 11, 1990 [JP] Japan ................... 2-121496

[51] Int. Cl.⁵ .................................. H01R 13/00
[52] U.S. Cl. ................................................ 439/91
[58] Field of Search ........................... 439/86-91

[56] References Cited

U.S. PATENT DOCUMENTS

| | | | |
|---|---|---|---|
| 3,680,037 | 7/1972 | Nellis et al. | 439/91 |
| 3,998,513 | 12/1976 | Kobayashi et al. | 439/91 |
| 4,008,300 | 2/1977 | Ponn | 439/91 |
| 4,201,435 | 5/1980 | Nakamura et al. | 439/91 |
| 5,058,800 | 10/1991 | Yoshizawa et al. | 228/180.2 |

FOREIGN PATENT DOCUMENTS 63-151031 6/1988 Japan.
63-222437 9/1988 Japan.
63-224235 9/1988 Japan.

*Primary Examiner*—Joseph H. McGlynn
*Attorney, Agent, or Firm*—Fitzpatrick, Cella, Harper & Scinto

[57] ABSTRACT

An electrical connecting member comprising a holder made of electrically insulative material and a plurality of conductive members electrically insulated from each other and embedded in the holder and having ends exposed from the holder, and wherein a conductive adhesive layer eutectoidally formed from an adhesive resin solution including one or both of pulverized metal powder and metalized ceramic powder by electrophoresis method is disposed on the end of each conductive member exposed from one surface of the holder. A conductive adhesive layers and the other ends of the conductive members exposed from the other surface of the holder are flush with or protruded from the surfaces of the holder.

24 Claims, 16 Drawing Sheets

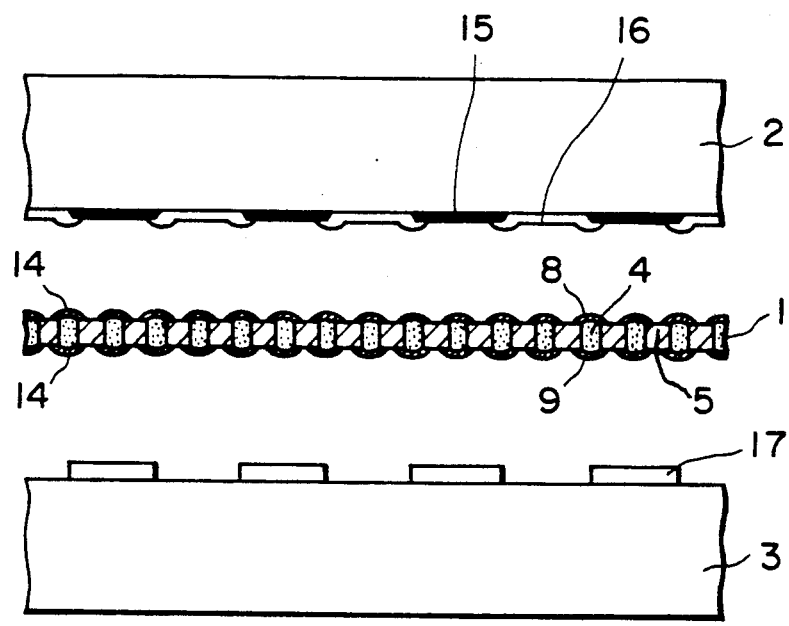
F I G. 7A
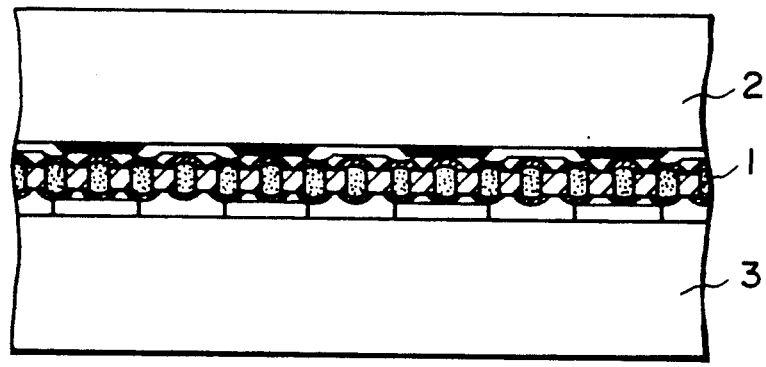
F I G. 7B

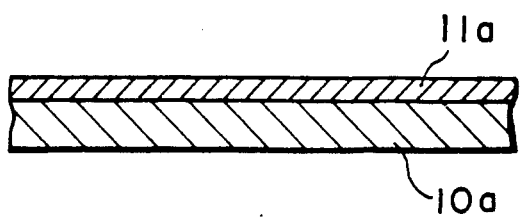
F I G. 8A
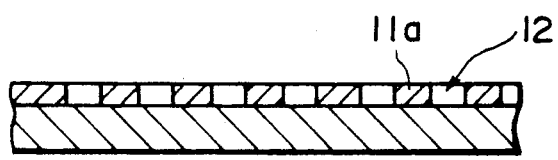
F I G. 8B
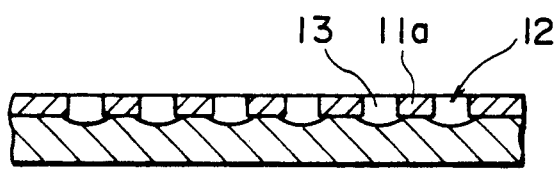
F I G. 8C
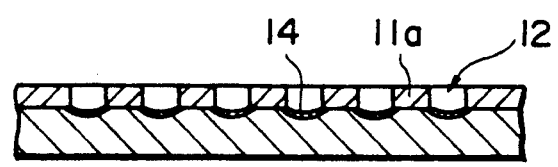
F I G. 8D

ELECTRICAL CONNECTING MEMBER AND ELECTRIC CIRCUIT MEMBER

This application is a continuation of application Ser. No. 07/697,776 filed May 9, 1991, now abandoned.

BACKGROUND OF THE INVENTION

1. Field of the Invention

The present invention relates an electrical connecting member, and an electric circuit member wherein parts of an electric circuit are connected to a substrate and the like through the electrical connecting member.

2. Related Background Art

In the past, the connection between a substrate such as a circuit board and parts of an electric circuit was effected by using a connector method, press-fit terminal method, soldering method, wire bonding method, TAB (tape automated bonding) method, CCB (controlled collapsed bonding) method, or a method utilizing anisotropy conductive film. However, in such methods, since minimum pitches between adjacent connecting portions for preventing them from contacting with each other were relatively great, even if the smaller pitches between the adjacent connecting portions were required, such requirements could not be satisfied. Further, in such methods, since the longer wiring was required, the resistance value and the stray capacity were increased to deteriorate the electrical feature.

In order to solve the above problems, a technique wherein electric circuit parts are electrically connected to each other by means of an electrical connecting member comprising a plurality of conductive members electrically insulated from each other and held in an insulative holder or by means of an electrical connecting member comprising connecting conductive members wired in and/or on an insulative holder and having both ends exposed on the insulative holder with being flush with or protruding from the both surfaces of the insulative holder has been proposed, as disclosed in the Japanese Patent Laid-Open Nos. 63-222437 and 63-224235.

FIGS. 1A and 1B schematically, in section, show the electrical connection between the electric circuit parts effected by using such electrical connecting member.

In FIGS. 1A and 1B, the reference numeral 1 denotes the electrical connecting member; and 2 denotes the electric circuit parts to be connected. The electrical connecting member 1 comprises a plurality of rod-like conductive members 4 made of metal or alloy and electrically insulated from each other and embedded in a thin plate-shaped holder 5 made of electrically insulative material. Both ends of each conductive member 4 are protruded towards the electric circuit parts 2 and 3 as bumps 8 and 9, respectively (see FIG. 1A).

Connecting portions 6 of the electric circuit part 2 and the bumps 8 of the conductive members 4, and connecting portions 7 of the electric circuit part 3 and the bumps 9 of the conductive members 4 are, respectively, connected to each other by metalizing and/or alloying them, for example, by means of thermal pressure welding process or ultrasonic heating process, thus electrically connecting the electric circuit parts 2 and 3 to each other (see FIG. 1B).

By the way, as a method for manufacturing the above-mentioned electrical connecting member 1, a method shown in FIGS. 2A to 2E has been proposed.

In this method, first of all, a photosensitive resin layer 11 acting as the holder 5 is coated on a conductive copper foil 10 (see FIG. 2A). Then, holes 12 are formed in the photosensitive resin layer 11 to expose the copper foil 10, by exposing and developing the layer at predetermined positions where the conductive members 4 are embedded at a later process. Then, by increasing the temperature, the photosensitive resin layer 11 is cured (see FIG. 2B). Thereafter, by etching the copper foil 10 exposed through the holes 12, recesses 13 are formed in the copper foil 10 under the holes 12 (see FIG. 2C). Then, the conductive members 4 are filled within the holes 12 and the recesses 13 by electroplating the copper foil 10 with metal so that the bumps 9 are formed in the recesses 13 and the bumps 8 are formed on the photosensitive resin layer 11 (see FIG. 2D). Thereafter, by removing the copper foil 10 by means of metal etching process, the electrical connecting member 1 is completed (see FIG. 2E).

However, in the method for connecting the connecting portions of the electric circuit parts to the bumps of the conductive members by metalizing and/or alloying them by means of the thermal pressure welding process or the ultrasonic heating process as shown in FIG. 1, since the electric circuit parts are exposed to heat during the connecting operation, if such parts have low heat-resistance, they cannot sometimes be connected.

By the way, a method for obtaining the electrical connection by relatively low temperature welding process, rather than the high temperature heating process is already known (refer to the Japanese Patent Laid-Open No. 63-151031). In this method, the electrical connection is obtained by positioning and pressure welding electrodes disposed on a circuit board and coated by ultraviolet radiation cured resin and electrodes of semiconductor elements with bumps and by curing the resin by means of the ultraviolet radiation. However, in this method, it is difficult to compose the resin, and, therefore, there arise many problems to obtain the desired resin. Further, since the resin is liable to be existed in the connecting portions, the connecting resistance is increased and/or the difference in the coefficient of thermal expansion is increased, thus arising the quality problem. Further, since there exists the resin between the adjacent connecting portions, the difference in the coefficient of thermal expansion is increased, thus arising the quality problem that the connecting portions are separated and/or the crack is generated.

SUMMARY OF THE INVENTION

The present invention aims to eliminate the above-mentioned conventional drawbacks, and an object of the present invention is to provide an electrical connecting member and an electric circuit member which can easily interconnect electric circuit parts with a low temperature by applying an electrical connecting member having a conductive adhesive layer formed by a relatively easy method to connecting portions.

Another object of the present invention is to provide an electrical connecting member comprising a holder made of electrically insulative material and a plurality of conductive members electrically insulated from each other and embedded in the holder and having ends exposed from the holder, and wherein a conductive adhesive layer eutectoidally formed from an adhesive resin solution including one or both of pulverized metal powder and metalized ceramic powder by electrophoresis process is disposed on the end of each conductive member exposed from one surface of the holder, and the conductive adhesive layer and the other end of each conductive member exposed from the other surface of the holder are flush with or protruded from the surface of the holder.

A further object of the present invention is to provide an electric circuit member comprising an electrical connecting member including a holder made of electrically insulative material and a plurality of conductive members electrically insulated from each other and embedded in the holder and having ends exposed from the holder, and wherein a conductive adhesive layer eutectoidally formed from an adhesive solution including one or both of pulverized metal powder and metalized ceramic powder by electrophoresis process is disposed on the end of each conductive member exposed from one surface of the holder, and the conductive adhesive layer and the other end of each conductive member exposed from the other surface of the holder are flush with or protruded from the surfaces of the holder; a first electric circuit part including connecting portions which are electrically connected to the conductive adhesive layers exposed from the one surface of the holder of the electrical connecting member; a second electric circuit part including connecting portions which are electrically connected to the other ends of the conductive members exposed from the other surface of the holder of the electrical connecting member.

A still further object of the present invention is to provide an electrical connecting member comprising a holder made of electrically insulative material and a plurality of conductive members electrically insulated from each other and embedded in the holder and having ends exposed from the holder, and wherein conductive adhesive layers eutectoidally formed from an adhesive resin solution including one or both of pulverized metal powder and metalized ceramic powder by electrophoresis process are disposed on both ends of each conductive member exposed from both surfaces of the holder, and the conductive adhesive layers are flush with or protruded from the surfaces of the holder.

A further object of the present invention is to provide an electric circuit member comprising an electrical connecting member including a holder made of electrically insulative material and a plurality of conductive members electrically insulated from each other and embedded in the holder and having ends exposed from the holder, and wherein conductive adhesive layers eutectoidally formed from an adhesive resin solution including one or both of pulverized metal powder and metalized ceramic powder by electrophoresis process are disposed on both ends of each conductive member exposed from both surfaces of the holder, and the conductive adhesive layers are flush with or protruded from the surfaces of the holder; a first electric circuit part including connecting portions which are electrically connected to the conductive adhesive layers exposed from the one surface of the holder of the electrical connecting member; a second electric circuit part including connecting portions which are electrically connected to the conductive adhesive layers members exposed from the other surface of the holder of the electrical connecting member.

The other object of the present invention is to provide an electric circuit member comprising an electrical connecting member including a holder made of electrically insulative material and a plurality of conductive members electrically insulated from each other and embedded in the holder and having ends exposed from the holder, and wherein both ends of each conductive member are flush with or protruded from the surfaces of the holder; a substrate including connecting portions wherein conductive adhesive layers eutectoidally formed from an adhesive resin solution including one or both of pulverized metal powder and metalized ceramic powder by electrophoresis process are disposed on metal electrodes of a wiring pattern arranged on the electrically insulative material and which are electrically connected to the ends of the conductive members exposed from one surface of the holder of the electrical connecting member; and an electric circuit part including connecting portions which are electrically connected to the ends of the conductive members exposed from the other surface of the holder of the electrical connecting member.

BRIEF DESCRIPTION OF THE DRAWINGS

FIGS. 7A and 7B, 9A and 9B, and 11A and 11B are schematic sectional views showing electric circuit members according to fourth, fifth and sixth embodiments of the present invention, respectively, where FIGS. A, 9A and 11A each shows elements before they are connected to each other, and FIGS. 7B, 9B and 11B each shows the elements after they have been connected;

FIGS. 8A to 8G are sequential views showing another example of a method for manufacturing an electrical connecting member according to the present invention;

DESCRIPTION OF THE PREFERRED EMBODIMENTS

Figure 1A:
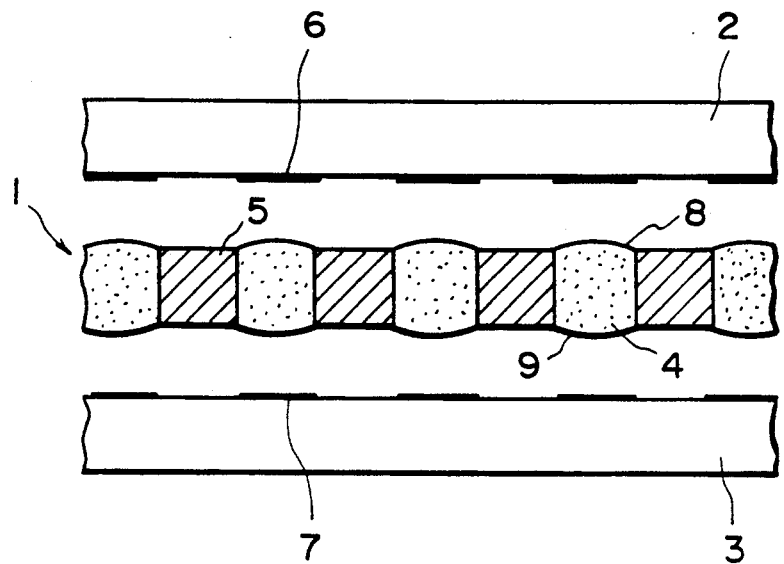
FIGS. 1A and 1B are schematic sectional views of a conventional electric circuit member.
Figure 1B:
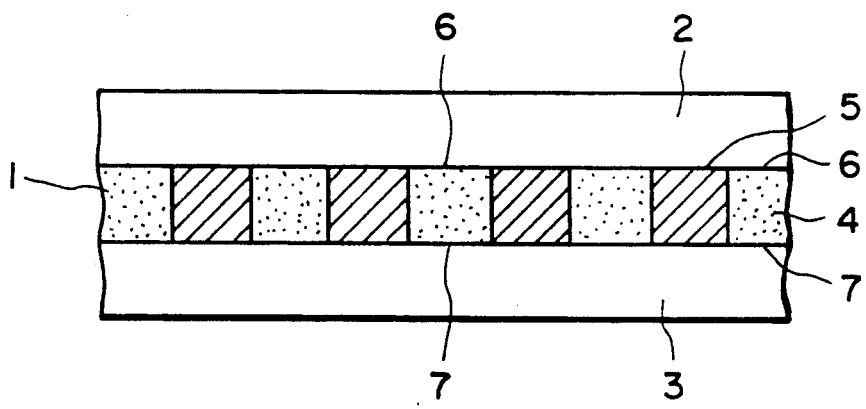

A principle of the present invention will now be fully explained.

According to a preferred aspect of the present invention, an electrical connecting member of the present invention comprises a holder made of electrically insulative material, and a plurality of conductive members electrically insulated from each other and embedded in the holder and having ends exposed from the holder. A conductive adhesive layer eutectoidally formed from an adhesive resin solution including one or both of pulverized metal powder and metalized ceramic powder by electrophoresis method is disposed on the end of each conductive member exposed from one surface of the holder. The conductive adhesive layers and the other ends of the conductive members exposed from the other surface of the holder are flush with or protruded from the surfaces of the holder.

According to another aspect of the present invention, an electrical connecting member of the present invention comprises a holder made of electrically insulative material, and a plurality of conductive members electrically insulated from each other and embedded in the holder and having ends exposed from the holder. Conductive adhesive layers eutectoidally formed from an adhesive resin solution including one or both of pulverized metal powder and metalized ceramic powder by electrophoresis method and disposed on both ends of each conductive member exposed from both surfaces of the holder. The conductive adhesive layers are flush with or protruded from the surfaces of the holder. The conductive adhesive layer is normally in a solid form, but may be in gel or sol form by heating.

In the electrical connecting member according to the present invention, it is preferable that a predetermined number of conductive members (among the plurality of conductive members) are wired in and/or on the holder so that these conductive members are electrically connected to each other.

Further, an average diameter of particles in the pulverized metal powder included in the conductive adhesive layer formed on the conductive member of the electrical connecting member is preferably in the order of 0.01-2 μm, and an average diameter of particles in the metalized ceramic powder is preferably in the order of 0.1-5 μm. Further, the content of one or both of the pulverized metal powder and metalized ceramic powder is preferably in the order of 30-80 wt%.

Next, according to a preferred aspect of the present invention, an electric circuit member is constituted by connecting the connecting portions of one of the electric circuit parts to the ends of the conductive members of the electrical connecting member according to the above-mentioned preferred aspect and by electrically connecting the connecting portions of the other electric circuit part to the conductive adhesive layers of the electrical connecting member by adhering effect.

According to another aspect of the present invention, an electric circuit member is constituted by electrically connecting the connecting portions of one of the electric circuit parts to the conductive adhesive layers of the electrical connecting member according to the above-mentioned another aspect by adhering effect, and by electrically connecting the connecting portions of the other electric circuit part to the conductive adhesive layers of the electrical connecting member.

According to a further aspect of the present invention, an electric circuit member comprises a holder made of electrically insulative material, and a plurality of conductive members electrically insulated from each other and embedded in the holder. The conductive members exposed from one surface of the electrical connecting member, and connecting portions of a substrate on which conductive adhesive layers eutectoidally formed from an adhesive resin solution including one or both of pulverized metal powder and metalized ceramic powder of electrophoresis method are disposed are electrically connected to each other by adhering effect. Further, the conductive members exposed from the other surface of the electrical connecting member, connecting portions of an electric circuit part are electrically connected to each other.

In such electric circuit members, since the electric circuit parts having low heat-resistance can be connected to the electric circuit member by adhering effect at a relatively low temperature, the connection can be easily performed and the versatility of selection of electric circuit parts is increased to extend the range of applications. Further, since only the connecting portions are connected, it is possible to avoid the quality problem due to the difference in coefficient of thermal expansion, and, thus, to obtain the electric circuit member with high quality. In addition, it is preferable that the conductive adhesive layers eutectoidally formed from an adhesive resin solution including one or both of pulverized metal powder and metalized ceramic powder by electrophoresis method are disposed on the connecting portions of the electric circuit part.

Further, by providing the conductive adhesive layers eutectoidally formed from an adhesive resin solution including one or both of pulverized metal powder and metalized ceramic powder by electrophoresis method on a metallic surface of the electric circuit part opposite to the surface on which the connecting portions are disposed, it is possible to obtain the electric circuit member having more excellent shielding ability. Further, the electric circuit parts associated with the present invention may include a casing, resin circuit board, metallic circuit board, ceramic circuit board, lead frame, semi-conductor element and the like.

Now, the embodiments of the present invention will be explained with more detail.

First of all, a first embodiment of the present invention will be described.

Figure 3A:
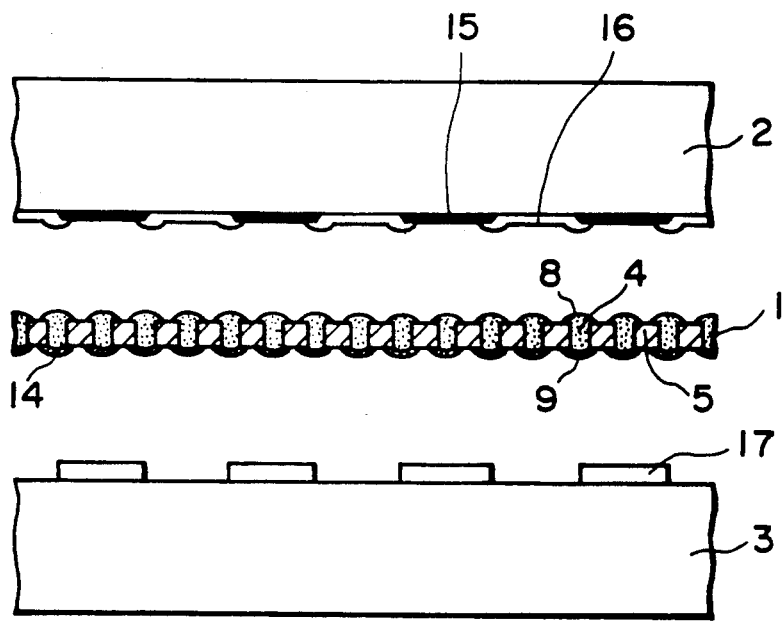
FIGS. 3A and 3B, 5A and 5B, and 6A and 6B are schematic sectional views showing electric circuit members according to first, second and third embodiments of the present invention, respectively, where FIGS. 3A, 5A and 6A each shows elements before they are connected to each other, and FIGS. 3B, 5B and 6B each shows the elements after they have been connected.
Figure 3B:
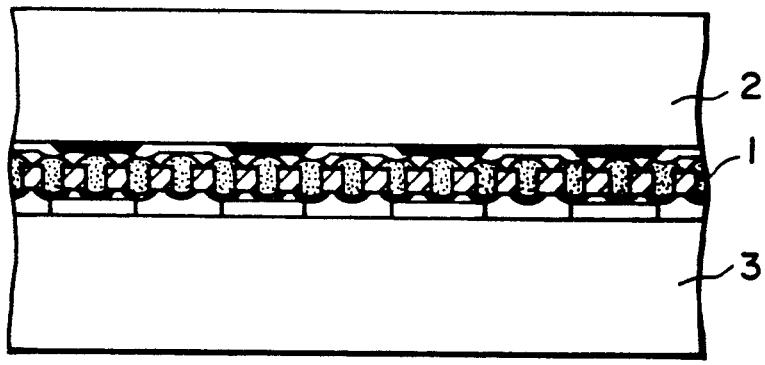

FIGS. 3A and 3B schematically show, in section, an electric circuit member according to a first embodiment of the present invention. In this embodiment, the electric circuit parts are connected to each other via an electrical connecting member having one surface on which conductive adhesive layers 14 are disposed. FIG. 3A shows various elements before they are connected to each other, and FIG. 3B shows the elements after they have been connected.

In FIGS. 3A and 3B, the reference numeral 1 denotes the electrical connecting member; 2 denotes a circuit board as one of the electric circuit part; and 3 denotes a semi-conductor element as the other of the electric circuit part.

Now, a method for manufacturing the electrical connecting member according to this embodiment with reference to FIGS. 4A to 4F.

Figure 2A:
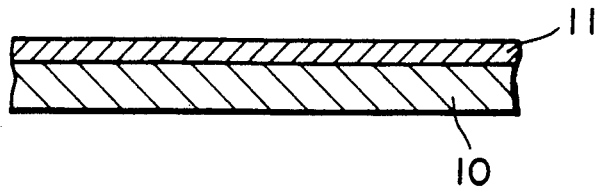
FIGS. 2A to 2E are sequential views showing an example of a method for manufacturing a conventional electrical connecting member.
Figure 2B:
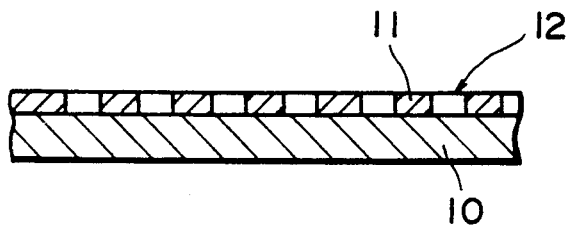
Figure 2C:
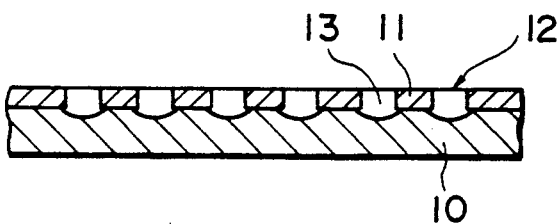
Figure 2D:
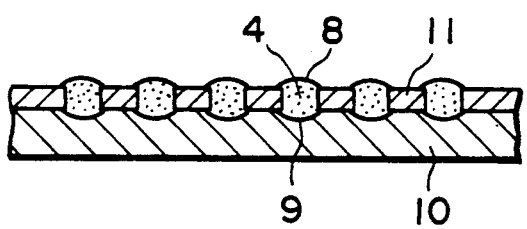
Figure 2E:
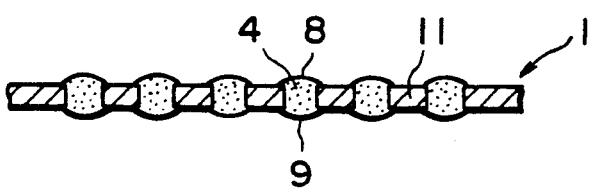
Figure 4A:
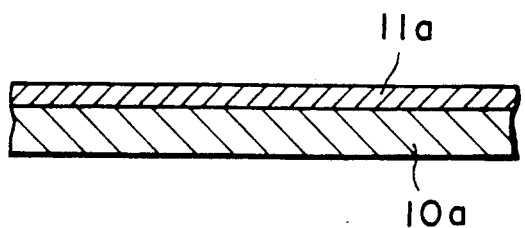
FIGS. 4A to 4F are sequential views showing an example of a method for manufacturing an electrical connecting member according to the present invention.
Figure 4B:
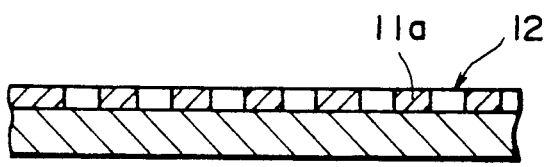
Figure 4C:
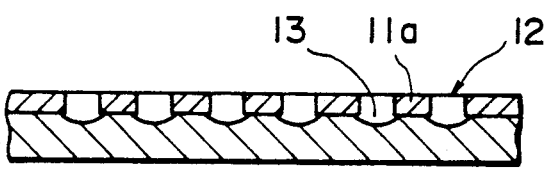
Figure 4D:
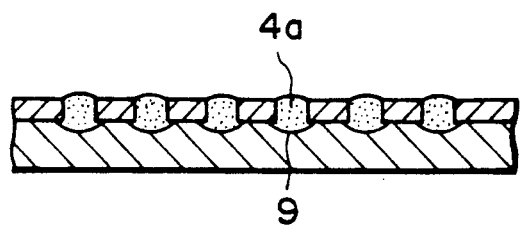
Figure 4E:
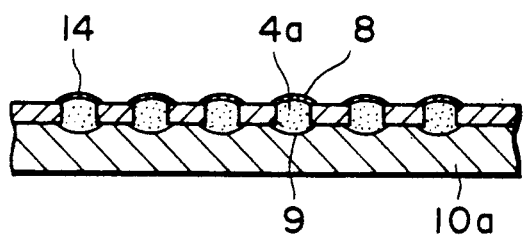

Sequences or processes shown in FIGS. 4A to 4C are the same as those of the conventional manufacturing method already explained with reference to FIGS. 2A to 2C. More particularly, first of all, a copper plate (substrate) 10a is prepared, and adhesion adjuvant (not shown) is coated on the copper plate 10a by utilizing a spinner. Thereafter, a photosensitive polyimide resin (negative photosensitive resin) layer 11a is coated on the adhesion adjuvant by utilizing the spinner and the article so obtained is pre-baked (see FIG. 4A). Now, in consideration of the reduction of a thickness of the layer due to the scattering of the solution and the curing of the resin itself, a thickness of the polyimide resin layer 11a to be coated is so selected as to be slightly greater than a desired thickness of the holder to be manufactured.

Then, the light is illuminated (exposed) on the polyimide resin layer 11a through a photo-mask (not shown) having a predetermined pattern, and then the layer 11a is developed. In this case, the density of energy of the incident light is set to have a value of 100-10,000 mJ/cm$^2$, and a developing time is 4-30 minutes. In the illustrated embodiment, the polyimide resin 11a remains on the exposed areas, and the polyimide resin 11a is removed from the non-exposed areas to form holes 12 having a diameter of about 10-20 μm. Thereafter, by increasing the temperature, the polyimide resin 11a is cured (see FIG. 4B).

By the way, even when the proper exposure condition and developing condition are set, the residual polyimide resin 11a (not shown) sometimes remains on the surface of the copper plate 10a in the holes 12. In such a case, by utilizing a dry etching process, the copper plate 10a is completely exposed. As the dry etching process, for example, O$_2$ plasma etching can be adopted, and, in this case, the etching condition will be as follows:

| | |
|---|---|
| High Frequency Electric Power | 200-400 W. |
| O$_2$ Flow Rate | 200 SCCM. |
| Pressure | 1 Torr. |
| Etching Time | 5-10 minutes. |

Next, the copper plate 10a so treated is immersed in the etching liquid to etch the plate. 0 Consequently, a portion of the copper plate 10a around the holes 12 is removed by etching to form recesses 13 in the copper plate which are communicated with the corresponding holes 12 (see FIG. 4C). By electroplating the copper plate 10a with utilizing the latter as a common electrode, gold (conductive material) 4a is embedded in the holes 12 and recesses 13 with protruding from the upper surface of the polyimide resin layer 11a in a convex shape, thus forming conductive members (see FIG. 4D).

Figure 4F:
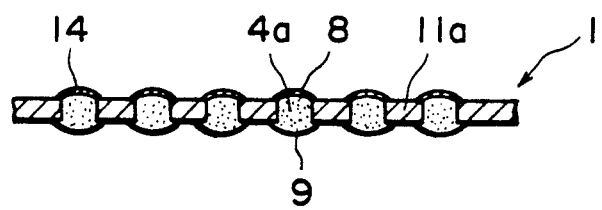

Then, polyester group resin ("FINETEX ES525", registered trade mark, sold by Dai-Nippon Ink Chemical Company, Japan) of 60 wt%, polyester group resin ("FINETEX 525", registered trade mark, sold by Dai-Nippon Ink Chemical Company, Japan) of 40 wt%, bridging agent ("PERMASTAT R-5", registered trade mark, sold by Dai-Nippon Ink Chemical Company, Japan) of 5 wt%, and catalyst ("Cat PA-20, registered trade mark, sold by Dai-Nippon Ink Chemical Company, Japan) of 40 wt% are mixed, and copper powder of 30 wt% including particles having an average diameter of 0.02 μm and powder of 20 wt% including alumina particles having an average diameter of 1 μm and electroplated with nickel with a thickness of 0.2 μm are further mixed to the above mixture. The mixture so obtained is dispersed in a ball mill for 30 minutes, and then is diluted with desalted water to become 15 wt%. Then, the electrodeposition treatment of the diluted solution is effected under a condition of temperature of 25° C. and pH of 8.5, with the substrate as anode and a stainless steel plate as a counterelectrode, by applying the voltage of 100 V for 1-2 minutes, thereby forming bumps 8 on the golden conductive members 4a with protruding from the polyimide resin layer 11a. Thereafter, by heating at a temperature of 50° C. for 10 minutes, conductive adhesive layers 14 are formed (see FIG. 4E). Preferably, a thickness of each conductive adhesive layer 14 is normally in the order of 1-100 μm. Lastly, by performing the metal etching process using the etchant so that copper can be removed but the gold 4a and the conductive adhesive layers 14 cannot be removed, the copper plate 10a is removed to obtain the electrical connecting member 1 as shown in FIG. 4F.

In the illustrated embodiment, the conductive members of the electrical connecting member 1 comprises the gold 4a and the conductive adhesive layers 14, and the holder comprises the polyimide resin layer 11a.

As the dry etching process, electronic cyclotron resonance (ERC) plasma etching, or laser etching using the illumination of excimer laser beam may be adopted, other than the above-mentioned O$_2$ plasma etching. Further, in the above-mentioned embodiment, while the electroplating with gold was effected to form the bumps protruding from the polyimide resin layer 11a in the convex form, such electroplating may be effected to form bumps with not protruding from the surface of the polyimide resin layer in a concave form, or such electroplating may be stopped at a stage where the gold are plated on the copper plate in a half-way in the holes 12. Incidentally, in place of the fact that the gold (conductive members) is filled in the holes 12 and the recesses 13 by means of the gold electroplating, other method, for example, deposition method, may be adopted.

In the illustrated embodiment, while the gold was used as the material for the conductive members, other metals such as Cu, Be, Ca, Mg, Mo, Ni, W, Fe, Ti, In, Ta, Zn, A(, Sn, Pb-Sn and the like or alloys may be used. The conductive member may be constituted by only one kind of metal or alloy, or may be constituted by mixing various kinds of metals or alloys. Further, the conductive member may be made of metallic material including either or both of organic material and inorganic material. Incidentally, a cross-section of the conductive member may be circular, rectangular or the like; but, in order to avoid the excessive concentration of stress, the cross-section of the conductive member has preferably a configuration without sharp edge. Further, it is not necessary that the conductive member is vertically disposed in the holder, but, such member may be oblique from one surface of the holder to the other.

In the illustrated embodiment, while an example that the polyimide resin is used as the photosensitive resin was explained, the present invention is not limited to this example. The photosensitive resin may include other known material or materials, and such material(s) can be included or added to the photosensitive resin in a well-known manner. Further, the resin used to form the conductive adhesive layer may be based on acrylic group resin, epoxy group resin, polyamide group resin, acrylmelamine group resin, polyacrylic acid group resin, other than polyester group resin.

The pulverized metal powder is not limited to the copper, but may be Au, Ag, A(, Be, Ca, Mg, Mo, Fe, Ni, Co, Mn, W, Cr, Nb, Zr, Ti, Ta, Zn, Sn, Pb-Sn and the like. Further, the ceramic powder may be ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, diamond, glass, carbon, boron and the like.

The metalized ceramic powder is formed by adhering metallic material to the above-mentioned ceramic powder. A method for adhering the metallic material to the ceramic powder may be a wet process such as plating, or a dry process such as deposition, spattering and the like.

Further, an average diameter of particles in the pulverized metal powder included in the conductive adhesive layers formed on the conductive member of the electrical connecting member is in the order of 0.01–2 µm, preferably, 0.05–1.5 µm, and an average diameter of particles in the metalized ceramic powder is in the order of 0.1–5 µm, preferably, 1.5–4 µm. One or both of the pulverized metal powder and metalized ceramic powder is included in the conductive adhesive layer, and the content thereof is normally in the order of 30–80 wt%, preferably, 35–45 wt%.

If both the pulverized metal powder and metalized ceramic powder are included in the conductive adhesive layer, it is preferable that the pulverized metal powder of 100 weight parts and the metalized ceramic powder of 20–80 weight parts may be mixed.

Next, in the electric circuit member shown in FIGS. 3A and 3B, the electrical connecting member 1 is constituted by a plurality of conductive members 4 consisting of gold and conductive adhesive layers and electrically insulated from each other and held in the holder 5 consisting of the polyimide resin, as shown in FIG. 4, and the bump 8 formed on one end of each conductive member 4 is protruded toward the electric circuit part 2, and the bump 9 comprised of the conductive adhesive layer 14 formed on the other end of each conductive member 4 is protruded toward the electric circuit part 3 (see FIG. 3A). And, the connecting portions 15 of the electric circuit part 2 which are not covered by passivation films 16 and the bumps 8 of the conductive members 4 exposed toward the electric circuit part 2 are connected to each other by metalizing and/or alloying them.

Further, connecting portions 17 of the electric circuit part 3 and the bumps 9 comprised of the conductive adhesive layers 14 of the conductive members 4 exposed toward the electric circuit part 3 are connected to each other by adhering effect to complete the electrical connection (see FIG. 3B). The temperature for connecting the aluminium material of the connecting portion of the electric circuit part 2 to the gold material of the conductive member is preferably in the order of 200°–400° C. Further, if the material of the connecting portion of the electric circuit part 2 is gold (Au), such temperature may be 200°–400° C.

On the other hand, the connection between the connecting portions 17 of the electric circuit part 3 and the conductive adhesive layers 14 can be effectively performed at a temperature lower than 180° C. Incidentally, in the connecting operation, although the positioning of the electric circuit parts 2 and 3 is required, since the pitch between the conductive members 4 of the electrical connecting member 1 is smaller than the pitch between the connecting portions 15 of the electric circuit part 2 and the pitch between the connecting portions 17 of the electric circuit part 3, the electrical connecting member 1 may be roughly positioned.

Next, a second embodiment of the present invention will be explained.

Figure 5A:
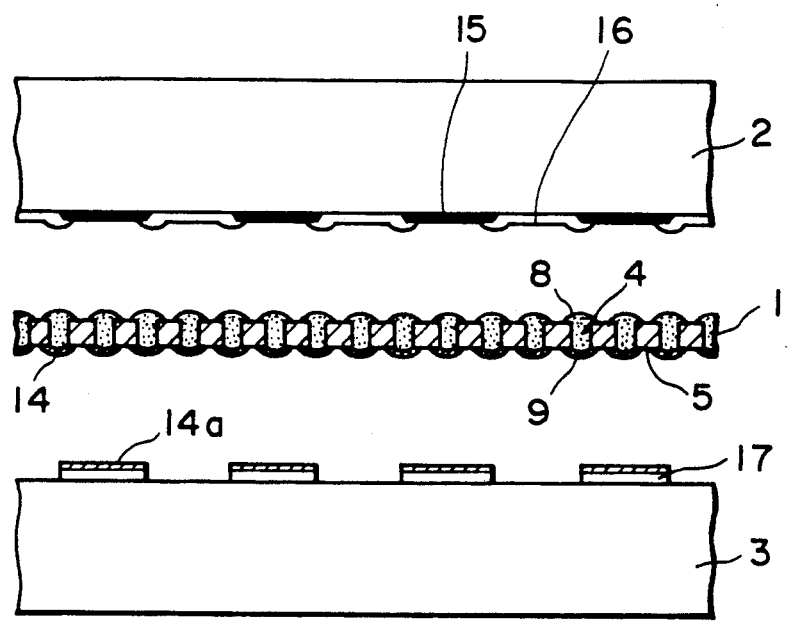
Figure 5B:
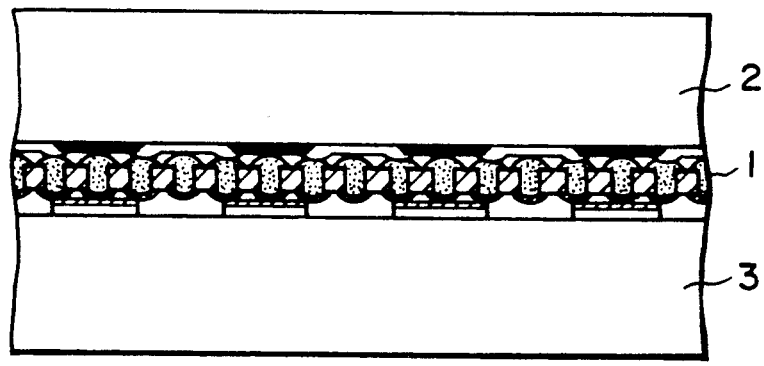

FIGS. 5A and 5B schematically show, in section, an electric circuit member according to a second embodiment of the present invention. In this embodiment, conductive adhesive layers 14a are disposed on the connecting portions 17 (same as those in the first embodiment comprising the copper foil) of the electric circuit part 3 in the same manner as the provision of the conductive adhesive layers of the electrical connecting member in the first embodiment. Other constructions are the same as those of the first embodiment. In this electric circuit member, even if the electric circuit part 3 is curved, the good connection can be attained.

Next, a third embodiment of the present invention will be explained.

Figure 6A:
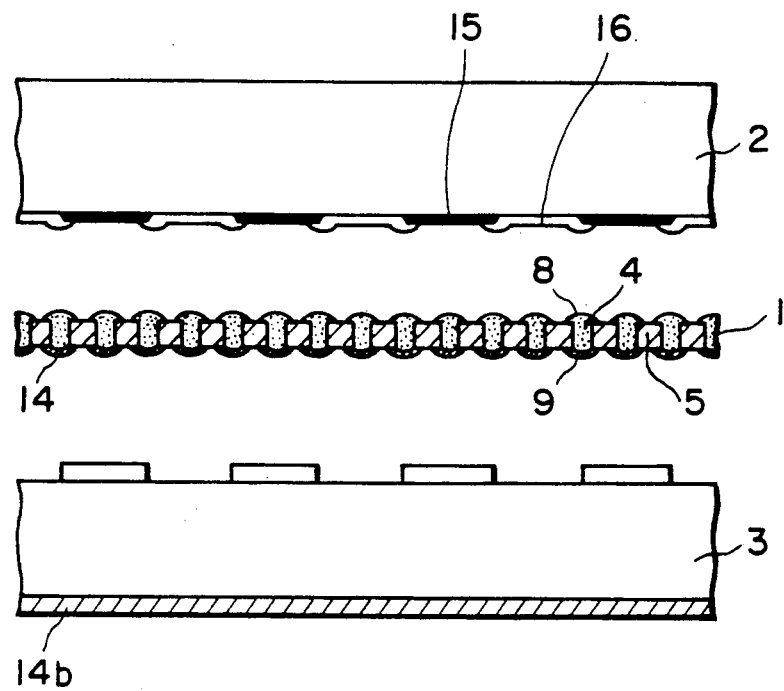
Figure 6B:
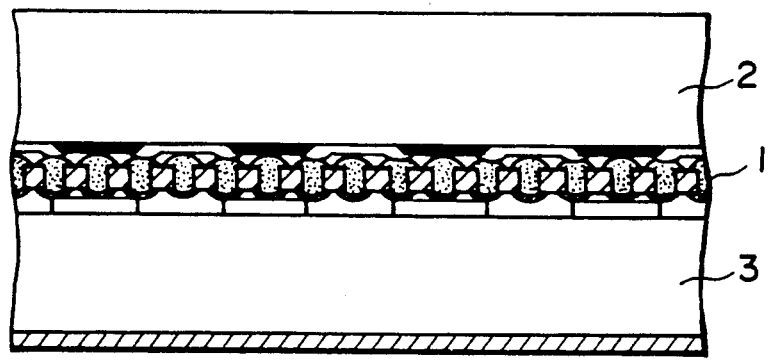

FIGS. 6A and 6B schematically show, in section, an electric circuit member according to a third embodiment of the present invention. In this embodiment, a conductive adhesive layer 14b is disposed on a surface of the electric circuit part 3 opposite to the surface thereof on which the connecting portions 17 (same as those in the first embodiment comprising the copper foil) are disposed, in the same manner as the provision of the conductive adhesive layers of the electrical connecting member in the first embodiment. Other constructions are the same as those of the first embodiment. In this electric circuit member, not only the good connection can be attained, but also the electric circuit member having a good shielding ability can be obtained.

Next, a fourth embodiment of the present invention will be explained.

FIGS. 7A and 7B schematically show, in section, an electric circuit member according to a fourth embodiment of the present invention. FIG. 7A shows various elements before they are connected to each other, and FIG. 7B shows the elements after they have been interconnected. This fourth embodiment is the same as the first embodiment, except that the conductive adhesive layers 14 are formed on both surfaces of the electrical connecting member in the same manner as the provision of the conductive adhesive layers of the electrical connecting member in the first embodiment.

Figure 8E:
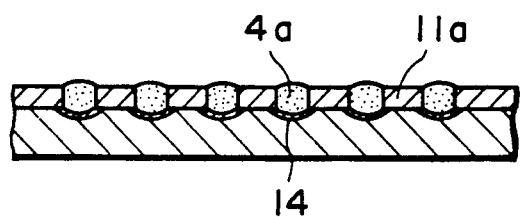
Figure 8F:
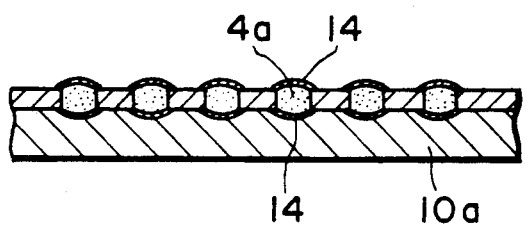
Figure 8G:
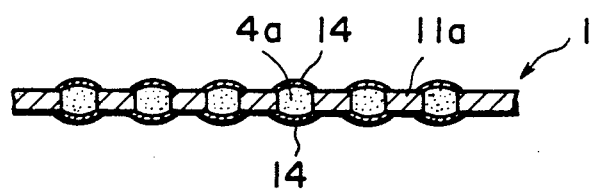

FIGS. 8A to 8G are schematic sectional views showing a method for manufacturing the electrical connecting member used in this embodiment. This manufacturing method differs from that shown in FIGS. 4A to 4F (associated with the first embodiment) in the point that, as shown in FIG. 8D, the conductive adhesive layers 14 are formed by electroplating with the copper plate 10a already having the recesses 13 communicating with the corresponding holes 12 as a common electrode. These conductive adhesive layers 14 are formed so thinner that they do not fill the holes 12 in the polyimide resin layer. The conductive adhesive layers 14 can be formed in the same manner as the formation of the conductive adhesive layers in the first embodiment.

Next, another method for manufacturing an electrical connecting member will be explained with reference to FIGS. 10A to 10H.

Figure 10A:
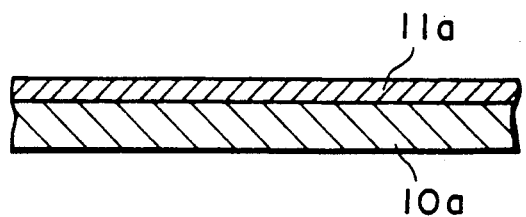
FIGS. 10A to 10H are sequential views showing a further example of a method for manufacturing an electrical connecting member according to the present invention.
Figure 10B:
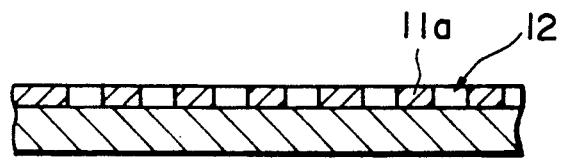
Figure 10C:
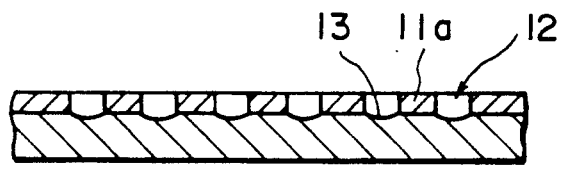
Figure 10D:
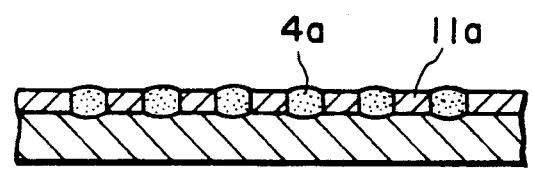
Figure 10E:
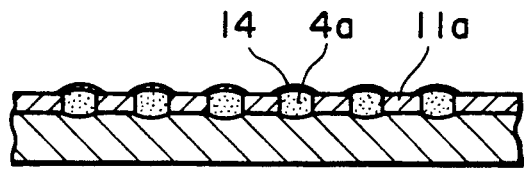

Processes shown in FIGS. 10A and 10B are carried out in the same manner as those shown in FIGS. 8A and 8B. Then, the copper plate 10a is etched to form recesses shallower than those shown in FIG. 8C (see FIG. 10C).

Figure 10F:
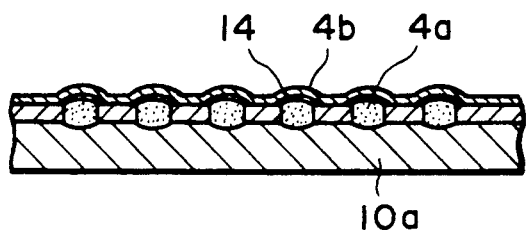
Figure 10G:
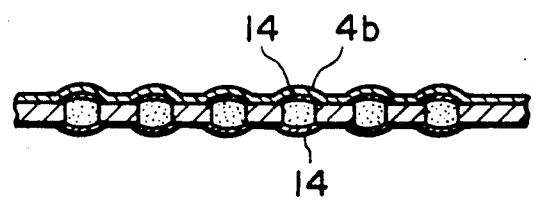
Figure 10H:
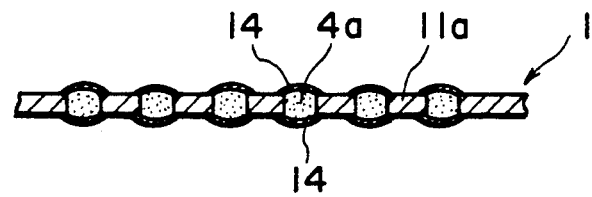

Thereafter, like to FIGS. 8D and 8E, the gold electroplating is effected to form the conductive members 4a slightly protruding above the upper surface of the polyimide resin layer 11a (see FIG. 10D), and, thereafter, the conductive adhesive layers 14 are formed (see FIG. 10E), and then, a metallic layer 4b is deposited on the conductive adhesive layers 14 and on the exposed polyimide resin layer 11a (see FIG. 10F). The metallic layer 4b acts as a common electrode later. Thereafter, the copper plate 10a is removed by the etching treatment, and then, by performing the electroplating treatment, with the metallic layer 4b as the common electrode, conductive adhesive layers 14 are formed on the conductive members 4a opposite to the metallic layer 4b (see FIG. 10G). Thereafter, the metallic layer 4b used as the common electrode is removed, thus obtaining the electrical connecting member 1 (see FIG. 10H). Incidentally, the common electrode may be formed after the copper plate 10a is removed.

In the electric circuit member shown in FIGS. 7A and 7B, the electrical connecting member 1 is constituted by a plurality of conductive members 4 comprised of gold and the conductive adhesive layers and electrically insulated from each other and held in the polyimide holder 5, as shown in FIG. 8 or FIG. 10, and the bumps 8 comprised of the conductive adhesive layers 14 disposed on one ends of the conductive members 4 are exposed toward the electric circuit part 2 and the bumps 9 comprised of the conductive adhesive layers 14 disposed on the other ends of the conductive members 4 are exposed toward the electric circuit part 3 (see FIG. 7A).

The connecting portions 15 of the electric circuit part 2 which are not covered by the passivation films 16 and the bumps 8 comprised of the conductive adhesive layers 14 of the conductive members 4 exposed toward the electric circuit part 2 are electrically connected to each other. Further the connecting portions 17 of the electric circuit part 3 and the bumps 9 comprised of the conductive adhesive layers 14 of the conductive members 4 exposed toward the electric circuit part 3 are connected to each other by the adhering effect, thus obtaining the electrical connection (see FIG. 7B). The temperature for connecting the connecting portions 15 of the electric circuit part 2 to the conductive adhesive layers of the conductive members 4 exposed toward the electric circuit part 2, and the temperature for connecting the connecting portions 15 of the electric circuit part 3 to the conductive adhesive layers of the conductive members 4 exposed toward the electric circuit part 3 may be lower than 180° C. to obtain the good connections.

Incidentally, in the connecting operation, although the positioning of the electric circuit parts 2 and 3 is required, since the pitch between the conductive members 4 of the electrical connecting member 1 is smaller than the pitch between the connecting portions 15 of the electric circuit part 2 and the pitch between the connecting portions of the electric circuit part 3, the electrical connecting member 1 may be roughly positioned. Further, in the illustrated embodiment, while the electrical connecting member 1 was connected to the electric circuit part 3 after the electrical connecting member 1 has been connected to the electric circuit part 2, the electrical connecting member may be connected to the electric circuit part 2 after it has been connected to the electric circuit part 3.

Next, a fifth embodiment of the present invention will be explained.

Figure 9A:
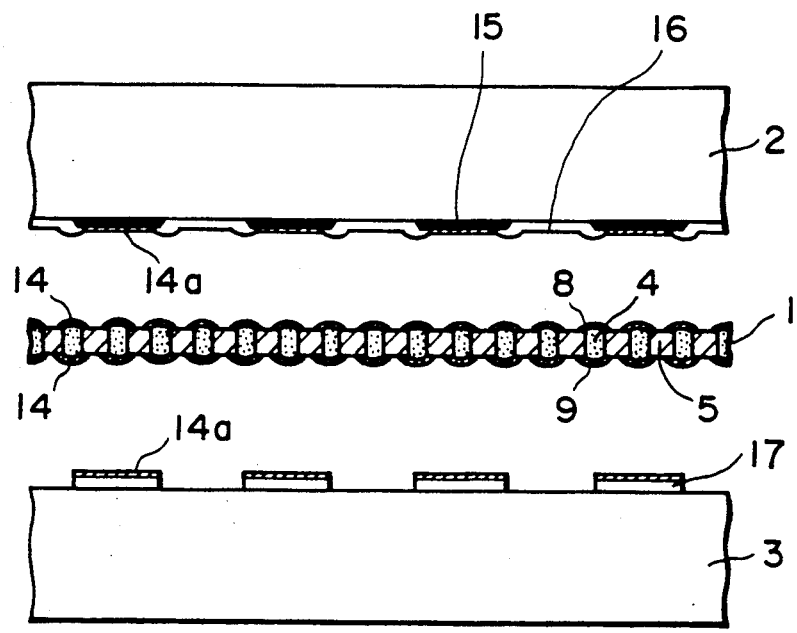
Figure 9B:
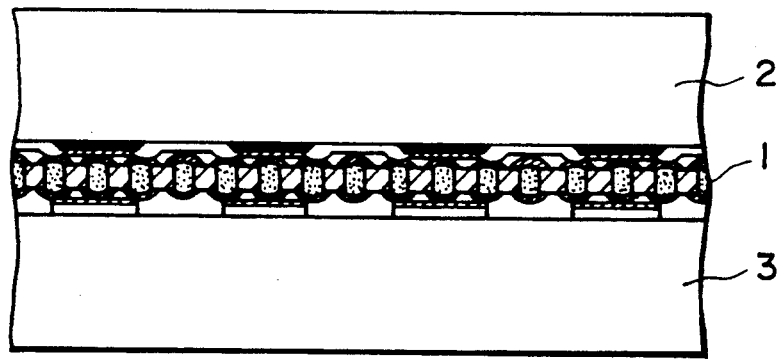

FIGS. 9A and 9B schematically show, in section, an electric circuit member according to a fifth embodiment of the present invention. In this embodiment, conductive adhesive layers 14a are disposed on the connecting portions 17 (same as those in the fourth embodiment comprising the copper foil) of the electric circuit part 3 and on the connecting portions 15 of the electric circuit part 2 in the same manner as the provision of the conductive adhesive layers of the electrical connecting member in the fourth embodiment. Other constructions are the same as those of the fourth embodiment. In this electric circuit member, even if the electric circuit parts 2, 3 are curved, the good connection can be attained.

Next, a sixth embodiment of the present invention will be explained.

Figure 11A:
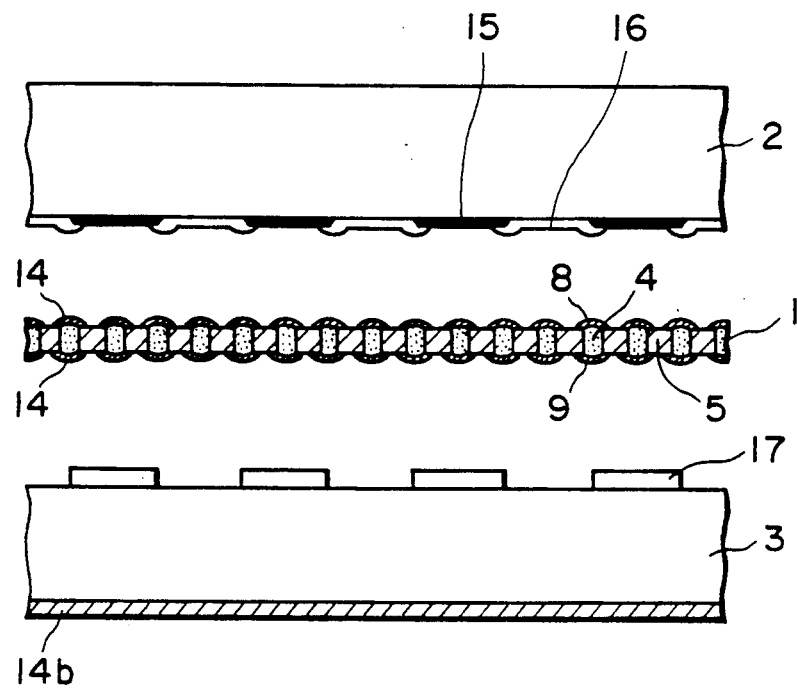
Figure 11B:
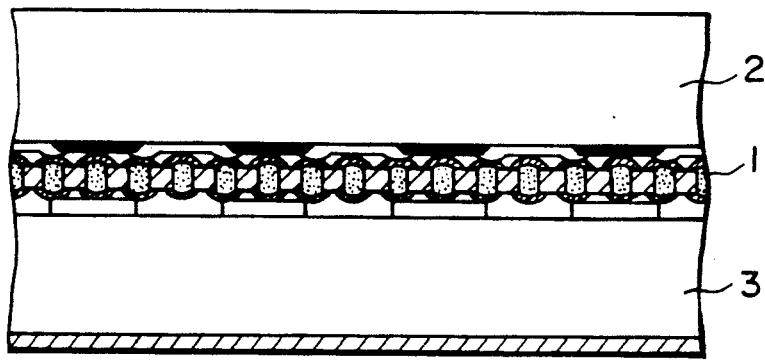

FIGS. 11A and 11B schematically show, in section, an electric circuit member according to a sixth embodiment of the present invention. In this embodiment, a conductive adhesive layer 14b is disposed on a surface of the electric circuit part 3 opposite to the surface thereof on which the connecting portions 17 (same as those in the fourth embodiment comprising the copper foil) are disposed, in the same manner as the provision of the conductive adhesive layers of the electrical connecting member in the fourth embodiment. Other constructions are the same as those of the fourth embodiment. In this electric circuit member, not only the good connection can be attained, but also the electric circuit member having a good shielding ability can be obtained.

Next, a seventh embodiment of the present invention will be explained.

Figure 12A:
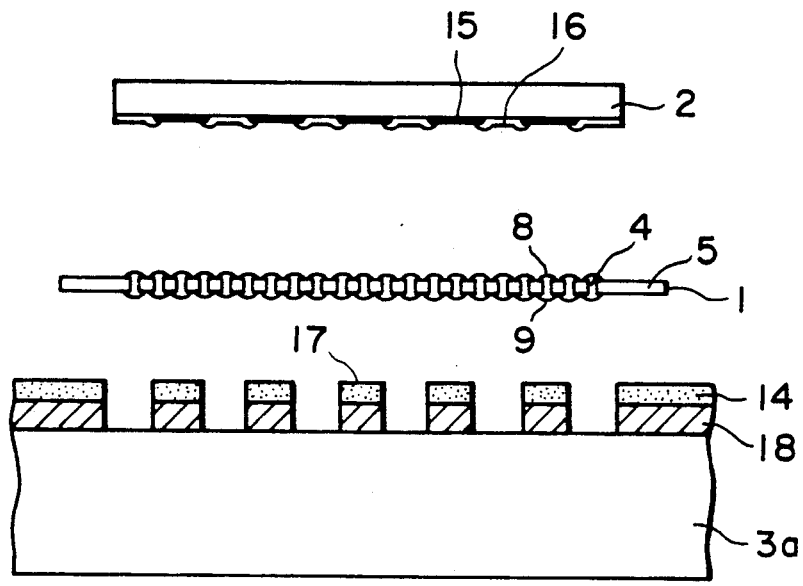
FIGS. 12A and 12B, and 13A and 13B are schematic sectional view showing electric circuit members according to seventh and eighth embodiments of the present invention, respectively, where FIGS. 12A and 13A each shows elements before they are connected to each other, and FIGS. 12B and 11B each shows the elements after they have been connected.
Figure 12B:
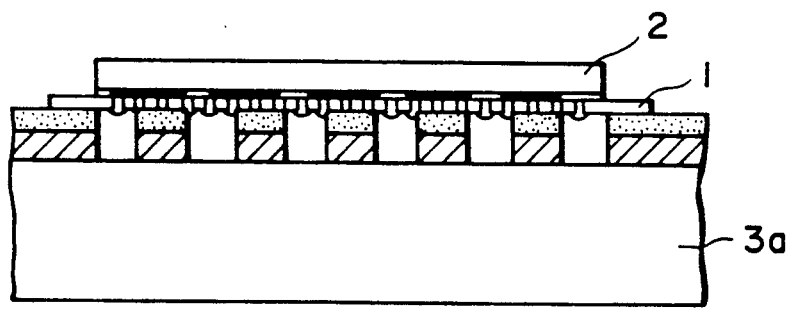

FIGS. 12A and 12B schematically show, in section, an electric circuit member according to a seventh embodiment of the present invention, and show a condition that a circuit board on which conductive adhesive layers are disposed and an electric circuit part are electrically connected to each other via an electrical connecting member. FIG. 12A shows various elements before they are connected to each other, and FIG. 12B shows the elements after they have been interconnected. The electrical connecting member 1 can be manufactured in a known manner.

In FIGS. 12A and 12B, the electrical connecting member 1 is constituted by a plurality of conductive members 4 made of gold and electrically insulated from each other and held in a polyimide holder 5, and the bump 8 formed on one end of each conductive member 4 is exposed toward the electric circuit part 2 and the bump 9 formed on the other end of each conductive member 4 is exposed toward the circuit board 3a (see FIG. 12A).

And, the connecting portions 15 of the electric circuit part 2 which are not covered by passivation films 16 and the bumps 8 of the conductive members 4 exposed toward the electric circuit part 2 are connected to each other by metalizing and/or alloying them, and the connecting portions 17 comprised of the conductive adhesive layers 14 formed on metallic electrodes 18 on the circuit board 3a are electrically connected to each other by the adhering effect to obtain the electrical connection (see FIG. 12B). The temperature for connecting the aluminium material of the connecting portion of the electric circuit part 2 to the gold material of the conductive member is preferably in the order of 200°–400° C. Further, if the material of the connecting portion of the electric circuit part 2 is gold (Au), such temperature may be 200°–400° C.

On the other hand, the connection between the connecting portions 17 of the conductive adhesive layers 14 of the electric circuit part 3 and the bumps 9 of the conductive members 4 can be effectively performed at a temperature lower than 180° C. Incidentally, in the connecting operation, although the positioning of the electric circuit part 2 and the circuit board 3a is required, since the pitch between the conductive members 4 of the electrical connecting member 1 is smaller than the pitch between the connecting portions 15 of the electric circuit part 2 and the pitch between the connecting portions 17 of the circuit board 3b, the electrical connecting member 1 may be roughly positioned.

Next, an example of a method for forming the conductive adhesive layers on the metal electrodes of the substrate will be explained.

After a copper foil having a thickness of 18 μm is deoiled by an alcohol solvent, it is further deoiled by alkali cleaner ("Pakuna #19", registered trade mark, sold by Uken Chemical Company, Japan) of 30 g/l at a temperature of 70° C. for 1 minute. Thereafter, the copper foil is washed by water and then is pickled by sulfate liquid of 10% for 30 seconds. Then, the copper foil is further washed by water and then is washed by desalted water, thus completing the surface activation treatment.

Thereafter, by utilizing the manner same as the manner for forming the conductive adhesive layers in the first embodiment, the conductive adhesive layers 14 are formed on the metal electrodes 18. Also in this embodiment, the good connection could be obtained.

Next, an eighth embodiment of the present invention will be explained.

Figure 13A:
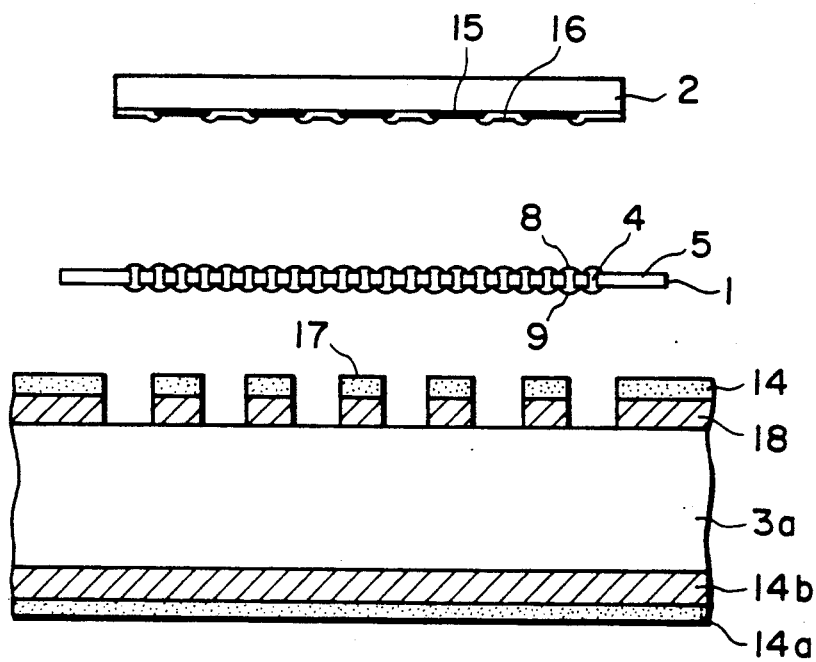
Figure 13B:
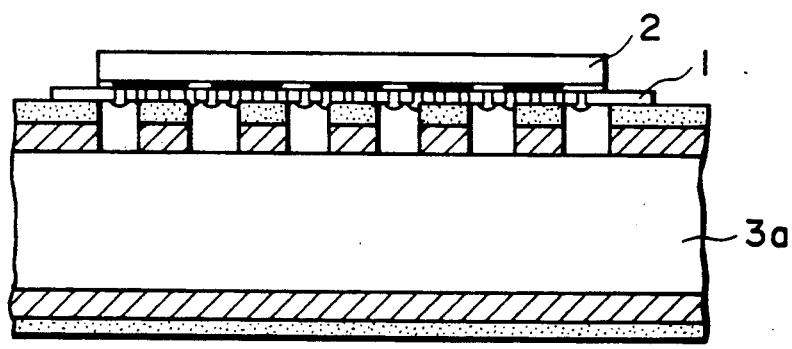

FIGS. 13A and 13B schematically show, in section, an electric circuit member according to an eighth embodiment of the present invention. In this embodiment, a copper foil 14b as wiring pattern is disposed on a surface of the circuit board 3a opposite to the surface thereof on which the connecting portions 17 (same as those in the seventh embodiment) are disposed, and a conductive adhesive layer 14a is formed on the copper foil 14b in the same manner as the provision of the conductive adhesive layers in the seventh embodiment. Other constructions are the same as those of the seventh embodiment. In this electric circuit member, not only the good connection can be attained, but also the electric circuit member having a good shielding ability can be obtained.

Next, a ninth embodiment of the present invention will be explained.

This embodiment differs from the first embodiment in the point that a wiring pattern is provided on the surface of the electrical connecting member 1 so that predetermined conductive members are electrically communicated with each other. Also in this embodiment, the good connection could be attained.

Next, a tenth embodiment of the present invention will be explained.

This embodiment differs from the fourth embodiment in the point that a wiring pattern is provided on the surface of the electrical connecting member 1 so that predetermined conductive members are electrically communicated with each other. Also in this embodiment, the good connection could be attained.

Lastly, an eleventh embodiment of the present invention will be explained.

This embodiment differs from the seventh embodiment in the point that a wiring pattern is provided on the surface of the electrical connecting member 1 so that predetermined conductive members are electrically communicated with each other. Also in this embodiment, the good connection could be attained.

As mentioned above, according to the electric circuit member using the electrical connecting member of the present invention, since the pitch between the conductive members can be smaller than the conventional ones and multi-pin connection can be permitted, it is possible to obtain the electric circuit member having high density. Further, since a length of the wiring can be shortened, the low resistant wiring can be attained, thus reducing the generation of heat and the stray capacity, with the result that the electrical feature is improved (such as less delay of signal), and the electric circuit member having the excellent electrical feature can be obtained. Particularly, this advantage is noticeable in the high frequency electric circuit.

Further, in the present invention, since the conductive adhesive layers eutectoidally formed from the adhesive resin solution including one or both of pulverized metal powder and metalized ceramic powder by electrophoresis method are disposed on the conductive members, the electrical connection can be attained by the adhering effect, with the result that electric circuit parts having relatively low heat resistance can be utilized. Further, since the connection can easily be effected, it is possible to obtain the electric circuit part having wider versatility. In addition, since only the connecting portions are connected, it is possible to obtain the electric circuit member having high reliability and high quality.

Furthermore, in the present invention, since the conductive adhesive layer is arranged on the metal surface of the electric circuit part opposite to the surface on which the connecting portions are formed, it is possible to obtain the electric circuit member having the good shielding ability, which can easily shield the electromagnetic noise from the electric circuit member to outside or vice versa.

We claim:

1. An electrical connecting member comprising:
   a holder made of electrically insulative material; and
   a plurality of conductive members electrically insulated from each other and embedded in said holder and having ends exposed from said holder; and wherein
   a conductive adhesive layer eutectoidally formed from an adhesive resin solution including one or both of pulverized metal powder and metalized ceramic powder by electrophoresis method is disposed on the end of each conductive member exposed from one surface of said holder, and said conductive adhesive layers and the other ends of said conductive members exposed from the other surface of said holder are flush with or protruded from the surfaces of said holder.

2. An electrical connecting member according to claim 1, wherein a wiring is provided in and/or on the surface of said holder so that a predetermined number of said conductive members among said plurality of conductive members are electrically communicated with each other.

3. An electrical connecting member according to claim 1, wherein an average diameter of particles in said pulverized metal powder included in said conductive adhesive layer is 0.01-2 μm and an average diameter of particles in said metalized ceramic powder is 0.1-5 μm, and the content of one or both of said pulverized metal powder and metalized ceramic powder included in said conductive adhesive layer is 30-80 wt%.

4. An electric circuit member comprising:
   an electrical connecting member including a holder made of electrically insulative material and a plurality of conductive members electrically insulated from each other and embedded in said holder and having ends exposed from said holder, and wherein a conductive adhesive layer eutectoidally formed from an adhesive resin solution including one or both of pulverized metal powder and metalized ceramic powder by electrophoresis method is disposed on one end of each conductive member exposed from one surface of said holder, and said conductive adhesive layers and the other ends of said conductive members exposed from the other surface of said holder are flush with or protruded from the surfaces of said holder;

a first electric circuit part including connecting portions which are electrically connected to said conductive adhesive layers exposed from the one surface of said holder of said electrical connecting member; and a second electric circuit part including connecting portions which are electrically connected to the other ends of said conductive members exposed from the other surface of said holder of said electrical connecting member.

5. An electric circuit member according to claim 4, wherein a wiring is provided in and/or on the surface of said holder so that a predetermined number of said conductive members among said plurality of conductive members are electrically communicated with each other.

6. An electric circuit member according to claim 4, wherein the conductive adhesive layers eutectoidally formed from the adhesive resin solution including one or both of pulverized metal powder and metalized ceramic powder by electrophoresis method are disposed on said connecting portions of said electric circuit parts.

7. An electric circuit member according to claim 4, wherein the conductive adhesive layers eutectoidally formed from the adhesive resin solution including one or both of pulverized metal powder and metalized ceramic powder by electrophoresis method are disposed on a surface of said electric circuit part opposite to a surface thereof on which said connecting portions are arranged.

8. An electric circuit member according to claim 4, wherein an average diameter of particles in said pulverized metal powder included in said conductive adhesive layer is 0.01-2 $\mu$m and an average diameter of particles in said metalized ceramic powder is 0.1-5 $\mu$m, and the content of one or both of said pulverized metal powder and metalized ceramic powder included in said conductive adhesive layer is 30-80 wt%.

9. An electric circuit member according to claim 4, wherein said electric circuit parts comprise either a casing, a resin circuit board, a metal circuit board, a ceramic circuit board, a lead frame or a semi-conductor element.

10. An electrical connecting member comprising:
a holder made of electrically insulative material; and
a plurality of conductive members electrically insulated from each other and embedded in said holder and having ends exposed from said holder; and wherein
conductive adhesive layers eutectoidally formed from an adhesive resin solution including one or both of pulverized metal powder and metalized ceramic powder by electrophoresis method are disposed on both ends of each conductive member exposed from both surfaces of said holder, and said conductive adhesive layers are flush with or protruded from the surfaces of said holder.

11. An electrical connecting member according to claim 10, wherein a wiring is provided in and/or on the surface of said holder so that a predetermined number of said conductive members among said plurality of conductive members are electrically communicated with each other.

12. An electrical connecting member according to claim 10, wherein an average diameter of particles in said pulverized metal powder included in said conductive adhesive layer is 0.01-2 $\mu$m and an average diameter of particles in said metalized ceramic powder is 0.1-5 $\mu$m, and the content of one or both of said pulverized metal powder and metalized ceramic powder included in said conductive adhesive layer is 30-80 wt%.

13. An electric circuit member comprising:
an electrical connecting member including a holder made of electrically insulative material and a plurality of conductive member electrically insulated from each other and embedded in said holder and having ends exposed from said holder, and wherein conductive adhesive layers eutectoidally formed from an adhesive resin solution including one or both of pulverized metal powder and metalized ceramic powder by electrophoresis method are disposed on both ends of each conductive member exposed from both surfaces of said-holder, and said conductive adhesive layers are flush with or protruded from the surfaces of said holder;

a first electric circuit part including connecting portions which are electrically connected to said conductive adhesive layers exposed from the one surface of said holder of said electrical connecting member; and a second electric circuit part including connecting portions which are electrically connected to said conductive adhesive layers members exposed from the other surface of said holder of said electrical connecting member.

14. An electric circuit member according to claim 13, wherein a wiring is provided in and/or on the surface of said holder so that a predetermined number of said conductive members among said plurality of conductive members are electrically communicated with each other.

15. An electric circuit member according to claim 13, wherein the conductive adhesive layers eutectoidally formed from the adhesive resin solution including one or both of pulverized metal powder and metalized ceramic powder by electrophoresis method are disposed on said connecting portions of said electric circuit parts.

16. An electric circuit member according to claim 13, wherein the conductive adhesive layers eutectoidally formed from the adhesive resin solution including one or both of pulverized metal powder and metalized ceramic powder by electrophoresis method are disposed on a surface of said electric circuit part opposite to a surface thereof on which said connecting portions are arranged.

17. An electric circuit member according to claim 13, wherein an average diameter of particles in said pulverized metal powder included in said conductive adhesive layer is 0.01-2 $\mu$m and an average diameter of particles in said metalized ceramic powder is 0.1-5 $\mu$m, and the content of one or both of said pulverized metal powder and metalized ceramic powder included in said conductive adhesive layer is 30-80 wt%.

18. An electric circuit member according to claim 13, wherein said electric circuit parts comprise either a casing, a resin circuit board, a metal circuit board, a ceramic circuit board, a lead frame or a semi-conductor element.

19. An electric circuit member comprising:
an electrical connecting member including a holder made of electrically insulative material and a plurality of conductive members electrically insulated from each other and embedded in said holder and having ends exposed from said holder, and wherein both ends of each conductive member are flush with or protruded from the surfaces of said holder;
a substrate including connecting portions wherein conductive adhesive layers eutectoidally formed from an adhesive resin solution including one or both of pulverized metal powder and metalized ceramic powder by electrophoresis method are disposed on metal electrodes of a wiring pattern arranged on said electrically insulative material and which are electrically connected to the ends of said conductive members exposed from one surface of said holder of said electrical connecting member; and
an electric circuit part including connecting portions which are electrically connected to the ends of said conductive members exposed from the other surface of said holder of said electrical connecting member.

20. An electric circuit member according to claim 19, wherein a wiring is provided in and/or on the surface of said holder so that a predetermined number of said conductive members among said plurality of conductive members are electrically communicated with each other.

21. An electric circuit member according to claim 19, wherein the conductive adhesive layers eutectoidally formed from the adhesive resin solution including one or both of pulverized metal powder and metalized ceramic powder by electrophoresis method are disposed on a metal surface of said substrate opposite to a surface thereof on which said conductive adhesive layers are arranged.

22. An electric circuit member according to claim 19, wherein an average diameter of particles in said pulverized metal powder included in said conductive adhesive layer is 0.01–2 $\mu$m and an average diameter of particles in said metalized ceramic powder is 0.1–5 $\mu$m, and the content of one or both of said pulverized metal powder and metalized ceramic powder included in said conductive adhesive layer is 30–80 wt%.

23. An electric circuit member according to claim 19, wherein said electric circuit part comprises either a resin circuit board, a metal circuit board, a ceramic circuit board, a lead frame or a semi-conductor element.

24. An electric circuit member according to claim 19, wherein said substrate comprises either a casing, a circuit board or a lead frame.

* * * * *

UNITED STATES PATENT AND TRADEMARK OFFICE
CERTIFICATE OF CORRECTION

PATENT NO. : 5,174,766

DATED : December 29, 1992

INVENTOR(S) : TETSUO YOSHIZAWA, ET AL.

It is certified that error appears in the above-identified patent and that said Letters Patent is hereby corrected as shown below:

On the Title page,
item [57] ABSTRACT

Line 12, "layers" should read --layer--.

COLUMN 1

Line 10, "relates" should read --relates to--.

COLUMN 4

Line 53, "view" should read --views--.

COLUMN 7

Line 32, "0" should be deleted.

COLUMN 8

Line 31, "A(," should read --Al,--.
   Line 58, "A(," should read --Al,--.

COLUMN 9

Line 2, "spattering" should read --sputtering--.

COLUMN 10

Line 59, "like" should read --similar--.

UNITED STATES PATENT AND TRADEMARK OFFICE
CERTIFICATE OF CORRECTION

PATENT NO. : 5,174,766

DATED : December 29, 1992

INVENTOR(S) : TETSUO YOSHIZAWA, ET AL.

It is certified that error appears in the above-identified patent and that said Letters Patent is hereby corrected as shown below:

<u>COLUMN 16</u>

Line 35, "layers members" should read --layer members--.

Signed and Sealed this

Thirtieth Day of November, 1993

Attest:

BRUCE LEHMAN

Attesting Officer     Commissioner of Patents and Trademarks